United States Patent [19]
Meyer, IV et al.

[11] Patent Number: 5,826,645
[45] Date of Patent: Oct. 27, 1998

[54] INTEGRATED CIRCUIT HEAT SINK WITH ROTATABLE HEAT PIPE

[75] Inventors: George A. Meyer, IV, Conestoga; Jerome E. Toth, Hatboro, both of Pa.

[73] Assignee: Thermal Corp., Georgetown, Del.

[21] Appl. No.: 844,811

[22] Filed: Apr. 23, 1997

[51] Int. Cl.$^6$ .................................................. F28D 15/00
[52] U.S. Cl. .................... 165/104.33; 257/719; 361/700
[58] Field of Search .......... 174/252; 165/80.1, 165/80.2, 104.33, 185; 361/700, 707, 710, 711, 709, 718, 783; 257/713, 718, 719

[56] References Cited

U.S. PATENT DOCUMENTS

| | | | |
|---|---|---|---|
| 4,588,023 | 5/1986 | Munekawa | 165/104.33 |
| 5,095,404 | 3/1992 | Chao | 165/104.33 |
| 5,402,160 | 3/1995 | Kadowaki et al. | 165/104.33 X |
| 5,464,054 | 11/1995 | Hinshaw et al. | 165/80.3 |
| 5,513,070 | 4/1996 | Xie et al. | 361/700 |
| 5,549,155 | 8/1996 | Meyer et al. | 165/104.33 |
| 5,646,822 | 7/1997 | Bhatia et al. | 165/104.33 X |

FOREIGN PATENT DOCUMENTS 0589793  3/1994  European Pat. Off. ................. 174/66

*Primary Examiner*—Hyung S. Sough
*Attorney, Agent, or Firm*—Martin Fruitman

[57] ABSTRACT

An apparatus is a heat conducting connection between a heat pipe and a structure such as an integrated circuit heat sink. The heat sink contains a groove with extension tabs protruding above edges of the groove so that the tabs can be bent over to hold the heat pipe in the groove which is dimensioned to give a clearance space around the heat pipe. When the tabs are bent down far enough to deform the heat pipe or a heat conductive hardening material is used to fill the clearance space, the heat pipe is fixed in place. If the tabs are bent down to barely contact the heat pipe and a heat conductive non-hardening material is used to fill the clearance space, the heat pipe can still be rotated within the groove.

7 Claims, 2 Drawing Sheets

INTEGRATED CIRCUIT HEAT SINK WITH ROTATABLE HEAT PIPE

BACKGROUND OF THE INVENTION

This invention relates generally to active solid state devices, and more specifically to a heat sink for an integrated circuit chip which uses a heat pipe and has the heat dissipator pressed against the integrated circuit.

With the advent of high speed integrated circuits for computers, the cooling of integrated circuit chips has become both more critical and more difficult. Even desk top computers which are connected to electrical power lines and have comparatively unlimited space and power to locate and operate fans for cooling, are experiencing problems with fan noise and heat dissipation from the new, higher power integrated circuits, and desk top computers do not have the severe weight restrictions of the portable computers. Portable computers, the so called laptop computers, are more restricted in space, power, and weight, and such restrictions also create problems in cooling the critical integrated circuits and disposing of the generated heat. At the same time, the power dissipated by individual integrated circuits has significantly increased, so that the problems involved in removing heat have also increased.

The basic problem is that the heat is generated on the relatively small surface of the integrated circuit deep within the computer housing, and the heat must ultimately be dissipated to the environment outside the computer case. Numerous patents have addressed these problems, but most of the cooling devices are very complex and difficult to manufacture so that there are significant possibilities for improvement.

Some of the prior art devices use heat sinks which are massive parts and which are impractical to use in a laptop computer. Others make no effort to move the heat away from a heat sink which is in contact with the integrated circuit chip. With the high powers now prevalent in computers, heat which is not removed can build up adjacent to the integrated circuit and can lead to high temperatures and damage to the integrated circuit chip.

Another approach which is used for desktop computers, is a miniature fan built right into the integrated circuit socket. Unfortunately, such fans are not only noisy, but they subject the equipment to reliability problems, since the typical miniature fan has a much shorter life expectancy than the typical integrated circuit. The problem is made more severe by the fact that a fan failure can cause the destruction of the integrated circuit for which it was providing cooling. Such failures are reminiscent of the battle lost for want of a horseshoe nail, since the fan costs only a few dollars while the integrated circuit costs hundreds of dollars.

SUMMARY OF THE INVENTION

The present invention provides an inexpensive but very effective solution for the cooling of integrated circuits in both desktop and laptop computers. To cool any integrated circuit, a simple heat pipe is attached directly to the heat sink which is held against the integrated circuit, and another location of the heat pipe is attached to a wall of the casing or some other cooler location in the computer. It is the very simple means of attaching the heat pipe to the integrated circuit and to the cooled surface which yields the particular benefit of the present invention.

Very few parts are involved in the invention. One part is, of course, the heat pipe. It is a simple cylindrical heat pipe. A heat pipe is particularly well suited for moving heat away from the integrated circuit, since the heat generated by the integrated circuit is transferred to any cooler location. The evaporation and condensation cycle internal to the heat pipe moves the heat with virtually no temperature difference across the heat pipe. Therefore, a heat pipe attached to the heat sink of an integrated circuit and, for example, a cooled wall of a computer cabinet furnishes virtually the same cooling of the integrated circuit as would result from the integrated circuit being mounted directly on the cooled cabinet wall.

The invention is a structure for attaching a heat pipe to a heat conductive plate which can be either or both the heat sink of the integrated circuit or a cooled surface. The plate contains a groove with extension tabs or ridges protruding above the edges so that the tabs can be bent over to hold the heat pipe into the groove which is shaped and dimensioned as a clearance fit with the heat pipe. The degree of distortion of the tabs and the selection of a material to fill the clearance space between the heat pipe and the groove varies depending upon whether the heat pipe is to be stationary or rotating in the groove. When the tabs are bent down into interference contact with the heat pipe and a hardening heat conductive material is used, the heat pipe is held fixed. When the tabs are bent down to just contact the heat pipe and a non-hardening heat conductive material is used to fill the clearance space, the heat pipe can be rotated within the groove.

The heat pipe is thereby attached to an integrated circuit heat sink or other surface through a good heat conductive path, which consists of both the direct contact with the tabs on the heat sink and the short heat conductive path through the heat conductive material within the groove of the heat sink, which is, of course, also in contact with the heat sink. Moreover, a slight distortion of the heat pipe surface by contact with the deformed tabs can not only further enhance the thermal conductivity by assuring the bottom of the heat pipe is in direct contact with the heat sink, but it can also be used to permanently fix the position of the heat pipe within the groove. It should be appreciated that this same heat transferring attachment system can be used to attach a heat pipe to any cooled surface such as, for instance, a wall of the cabinet of the equipment or a finned heat sink at the end of the heat pipe remote from the integrated circuit.

The resulting thermal connection is not only inexpensive to produce, but also, when the tabs are not used to deform the heat pipe and non-hardening filler material is used, the heat pipe can be rotated within the heat sink. Such rotational contact is not of the nature of a bearing to permit constant rotation of the heat pipe, but rather a rotatable joint to permit occasional non-destructive rotation. This permits the connection to be moved with no concern about destroying it when occasional access to an integrated circuit or other component within the computer may be necessary. If an integrated circuit is to be removed, it is only necessary to pull the heat pipe and the heat spreading clamp off the integrated circuit by rotating the heat sink on the heat pipe and the heat pipe in the cooling surface to which it is attached. The assembly can then be replaced upon the integrated circuit by rotating the connections in the opposite directions.

The present invention thereby furnishes a very simple structure which can remove the heat from an integrated circuit, and, by means of the heat pipe, move the heat to a location in the equipment from which it can easily be dissipated.

DETAILED DESCRIPTION OF THE INVENTION

Figure 1:
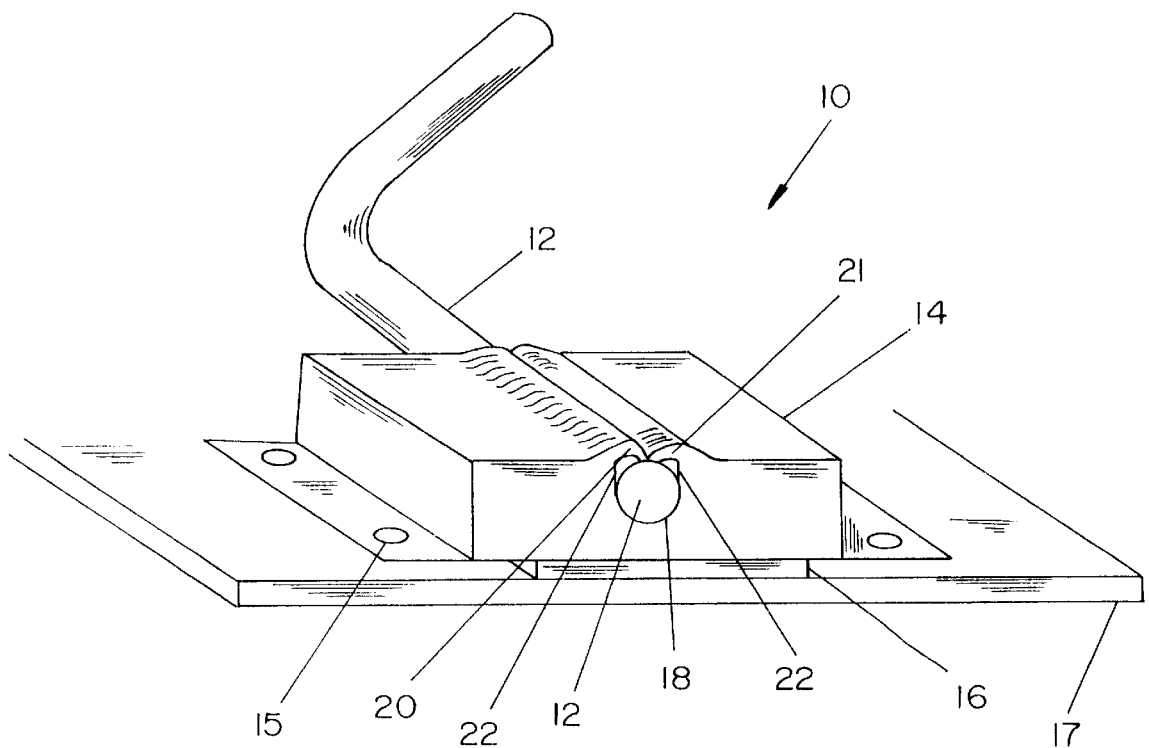
FIG. 1 is a perspective view of the preferred embodiment of the invention connecting a heat pipe to an integrated circuit heat sink.

FIG. 1 is a perspective view of the preferred embodiment of cooling assembly 10 connecting heat pipe 12 to heat sink 14 which is in heat conducting contact with integrated circuit 16. Heat sink 14 is held against integrated circuit 16 by conventional means such as the use of fasteners (not shown) through holes 15 holding heat sink 14 on base structure 17.

The connection between heat pipe 12 and heat sink 14 is accomplished quite simply by the placement of heat pipe 12 into groove 18 and holding heat pipe 12 in place by bending over tabs 20 and 21 into contact with heat pipe 12. Groove 18 is dimensioned relative to heat pipe 12 so that there is clearance space between heat pipe 12 and sidewalls 22 of groove 18. That is, the spacing between opposite sidewalls 22 of groove 18 is larger than the diameter of heat pipe 12 so that heat pipe 12 can be inserted into groove 18 without applying force. The clearance space between heat pipe 12 and sidewalls 22 can be better seen in FIG. 2.

Figure 2:
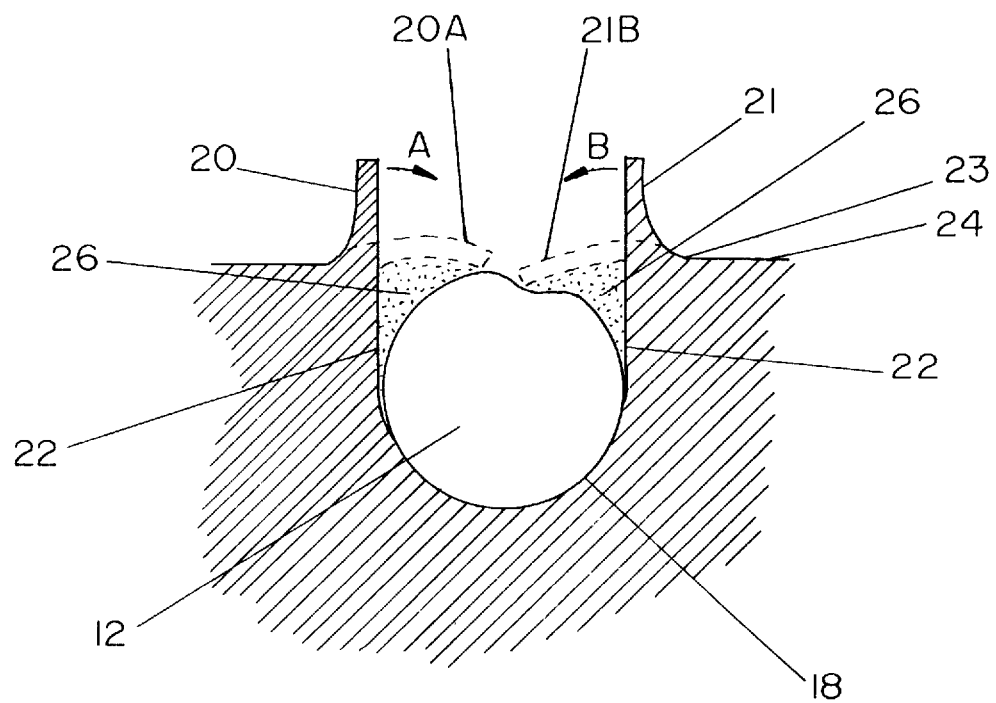
FIG. 2 is an enlarged cross section view of the invention across the heat pipe before the tabs are deformed to trap the heat pipe in the groove on the structure to which it is attached.

FIG. 2 is an enlarged cross section view across heat pipe 12 showing the placement of heat pipe 12 within groove 18 which is formed in surface 23 of conductive structure 24. Tabs 20 and 21 are formed at the junction of groove 18 and surface 23, extend above surface 23, and are then deformed by being bent over toward each other to trap heat pipe 12 in groove 18. Heat conductive structure 24 can be either heat sink 14 or a structure with a cooled surface dissipating the heat from integrated circuit 16. FIG. 2 also shows, with dashed lines, the two possible positions of tabs 20 and 21 after they have been deformed to trap heat pipe 12 within groove 18. FIG. 2 also shows heat conductive filler material 26 which occupies the space around heat pipe 12 to aid in heat conduction between heat pipe 12 and heat conductive structure 24.

Filler material 26 is used, as tabs 20 and 21 can also be, to determine whether heat pipe 12 is held rigidly within groove 18 or can be rotated. When filler material 26 is non-hardening material, heat pipe 12 can be rotated within groove 18 and heat conduction is maintained between heat pipe 12 and heat conductive plate 24. However, if it is desirable to prevent heat pipe 12 from rotating, a material which ultimately hardens into a rigid form is used for heat conductive filler material 26.

The dashed lines in FIG. 2 show the two possible positions of tabs 20 and 21 to hold heat pipe 12 in either a fixed or a rotatable position. Although usually both tabs would be deformed into the same position, FIG. 2 shows one in each of the two possible positions to facilitate comparison.

Dashed lines 20A show the position of tab 20 after it is is bent down in direction A so it just barely contacts heat pipe 12. This is the condition which permits heat pipe 12 to rotate. In a typical structure using the preferred embodiment of the invention with this rotatable connection, a heat pipe using water as its heat transfer fluid, having a 3.0 mm diameter, and mounted in a 3.0 mm deep groove with sidewalls 3.1 mm apart uses thermal grease, such as Emerson and Cummings TC-8 thermal compound as the filler material. Ten watts of heat can then be transferred across this rotatable connection with a temperature drop of less than 3 degrees C. when heat conducting plate 24 is at 50 degrees C.

Dashed lines 21B show the position of tab 21 after it is bent down in direction B so it not only contacts heat pipe 12, but also deforms it. This is the condition which fixes heat pipe 12 in a single position, and, actually, only one tab needs to be bent down to deform heat pipe 12, just as is shown in FIG. 2, in order to lock heat pipe 12 in place and prevent rotation. In a typical structure using the preferred embodiment of the invention with this fixed connection, a heat pipe using water as its heat transfer fluid has a 3.0 mm diameter and is mounted in a 3.0 mm deep groove with sidewalls 3.1 mm apart, and the filler material used is thermally conductive epoxy such as H67MP by Epoxy Technologiess. The heat pipe walls are 0.5 mm thick and are deformed inward by 0.5 mm by bent tabs 20 and 21. Ten watts of heat can then be transferred across this fixed connection with a temperature drop of less than 3 degrees C. when heat conducting plate 24 is at 50 degrees centigrade.

The simple structure of the invention can thereby furnish an effective means of cooling integrated circuits within densely packed computers, and because it can provide either fixed or rotatable connections to heat sinks and cooled surfaces, it facilitates both initial assembly and subsequent servicing of such computers.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

For example, heat pipes of other than circular cross section can be used in the fixed heat pipe version of the invention as long as the mating groove is shaped to accommodate the chosen heat pipe.

What is claimed as new and for which Letters Patent of the United States are desired to be secured is:

1. An apparatus for removing heat from an integrated circuit comprising:
    a heat conductive structure;
    a groove with sides extending below a surface of the heat conductive structure;
    a heat pipe placed into the groove, wherein the heat pipe is dimensioned to have clearance space between an outer surface of the heat pipe and the sides of the groove;
    tabs formed at the junction of the groove and the surface into which the groove is formed, wherein the tabs extending above the surface are permanently deformed by being bent over toward each other and into contact with the heat pipe; and
    heat conductive filler material occupying the space in the groove between the heat pipe and the sides of the groove.

2. The apparatus of claim 1 wherein the filler material is non-hardening.

3. The apparatus of claim 1 wherein the filler material is non-hardening and the contact between the tabs and the heat pipe permits the heat pipe to rotate.

4. The apparatus of claim 1 wherein the filler material is hardened into a rigid structure.

5. The apparatus of claim 1 wherein at least one of said tabs is bent far enough so that it not only contacts the heat pipe, but it also deforms the heat pipe and prevents the heat pipe from rotating.

6. The apparatus of claim 1 wherein the heat conductive structure is a heat sink in contact with an integrated circuit.

7. The apparatus of claim 1 wherein the heat conductive structure includes a cooled surface.

* * * * *